(12) United States Patent
Chuang (10) Patent No.: US 7,391,250 B1
(45) Date of Patent: Jun. 24, 2008

(54) DATA RETENTION CELL AND DATA RETENTION METHOD BASED ON CLOCK-GATING AND FEEDBACK MECHANISM

(75) Inventor: Fu-Chai Chuang, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/849,296

(22) Filed: Sep. 2, 2007

(51) Int. Cl.
*H03K 3/356* (2006.01)

(52) U.S. Cl. .............. 327/211; 326/40; 326/46; 326/58; 326/104; 365/154; 327/203

(58) Field of Classification Search .......... 326/40, 326/46, 56–58, 104; 327/185, 199, 202–218, 327/544; 365/154, 189.08, 226
See application file for complete search history.

(56) References Cited

U.S. PATENT DOCUMENTS

| | | | |
|---|---|---|---|
| 4,540,903 A * | 9/1985 | Cooke et al. .............. 327/211 |
| 5,557,225 A * | 9/1996 | Denham et al. ............. 327/199 |
| 5,654,658 A * | 8/1997 | Kubota et al. .............. 327/202 |
| 6,445,236 B1 * | 9/2002 | Bernard et al. ............. 327/202 |
| 7,109,772 B2 * | 9/2006 | Tohsche .................. 327/218 |
| 7,180,348 B2 * | 2/2007 | Frederick et al. ........... 327/199 |
| 7,183,825 B2 * | 2/2007 | Padhye et al. ............. 327/202 |
| 2005/0218952 A1 * | 10/2005 | Padhye et al. ............. 327/218 |
| 2007/0001729 A1 * | 1/2007 | Branch et al. ............. 327/202 |

* cited by examiner

*Primary Examiner*—Rexford Barnie
*Assistant Examiner*—Jason M Crawford
(74) *Attorney, Agent, or Firm*—Winston Hsu (57) ABSTRACT

For retaining an output data signal of a data retention cell in a power-saving mode, a slave latch unit of the data retention cell is powered with a real power for preserving the output data signal. The output data signal is furnished backward to an input control circuit of the data retention cell. The data signal furnished to a master latch unit of the data retention cell is controlled to switch between an input data signal and the output data signal by the input control circuit in response to a retention signal. The switching of the data signal for refreshing the master latch unit is delayed by a delay unit of the input control circuit, which functions to make sure that the data-preserving process is properly operated on any transition from the power-saving mode to a power-active mode.

36 Claims, 7 Drawing Sheets

DATA RETENTION CELL AND DATA RETENTION METHOD BASED ON CLOCK-GATING AND FEEDBACK MECHANISM

BACKGROUND OF THE INVENTION

1. Field of the Invention

The present invention relates to a data retention cell and a data retention method, and more particularly, to a data retention cell and a data retention method based on clock-gating and feedback mechanism.

2. Description of the Prior Art

Lower power consumption has become a big demand for devising integrated circuits mainly due to wide spread use of portable and handheld applications. For instance, battery life is a very important consideration for the performance of handheld devices, and power consumption of handheld devices significantly affects the battery life. In order to reduce power consumption, integrated circuits can be operated in a power-saving mode by switching-off the power during standby operating, which can be done by decoupling either the supply voltage or the ground voltage provided to the integrated circuits.

The transistor used for controlling the coupling situation concerning the supply voltage is usually a PMOS transistor, which is normally termed the header sleep transistor. The transistor used for controlling the coupling situation concerning the ground voltage is usually an NMOS transistor, which is normally termed the footer sleep transistor. Consequently, the supply voltage can be classified into a real supply voltage and a virtual supply voltage, and the ground voltage can be classified into a real ground voltage and a virtual ground voltage. The real supply voltage and the virtual supply voltage are coupled via the header sleep transistor. The real ground voltage and the virtual ground voltage are coupled via the footer sleep transistor.

However, states or data signals of a circuit being stored in flip-flops may be lost in the power-saving mode. Accordingly, various schemes of data-retention circuits have been provided to preserve states or data signals of flip-flops while operating in the power-saving mode for standby operating. Please refer to FIG. 1, which is a conventional data retention cell 100 based on a balloon latch. The data retention cell 100 comprises a master latch unit 102 for receiving an input data signal D, a slave latch unit 106 for outputting an output data signal Q, a switch unit 104, and a balloon latch unit 108. The master latch unit 102 and the slave latch unit 106 function to operate as a master-slave flip-flop. The master latch unit 102 comprises two inverters 141, 142 for latching and three transmission gates 121-123 for controlling data transfer. The slave latch unit 106 comprises two inverters 143, 144 for latching and one transmission gate 124 for controlling data transfer. The switch unit 104 comprises two transmission gates 125, 126 for controlling data transfer. The balloon latch unit 108 comprises two inverters 145, 146 for latching and one transmission gate 127 for controlling data transfer.

Figure 1:
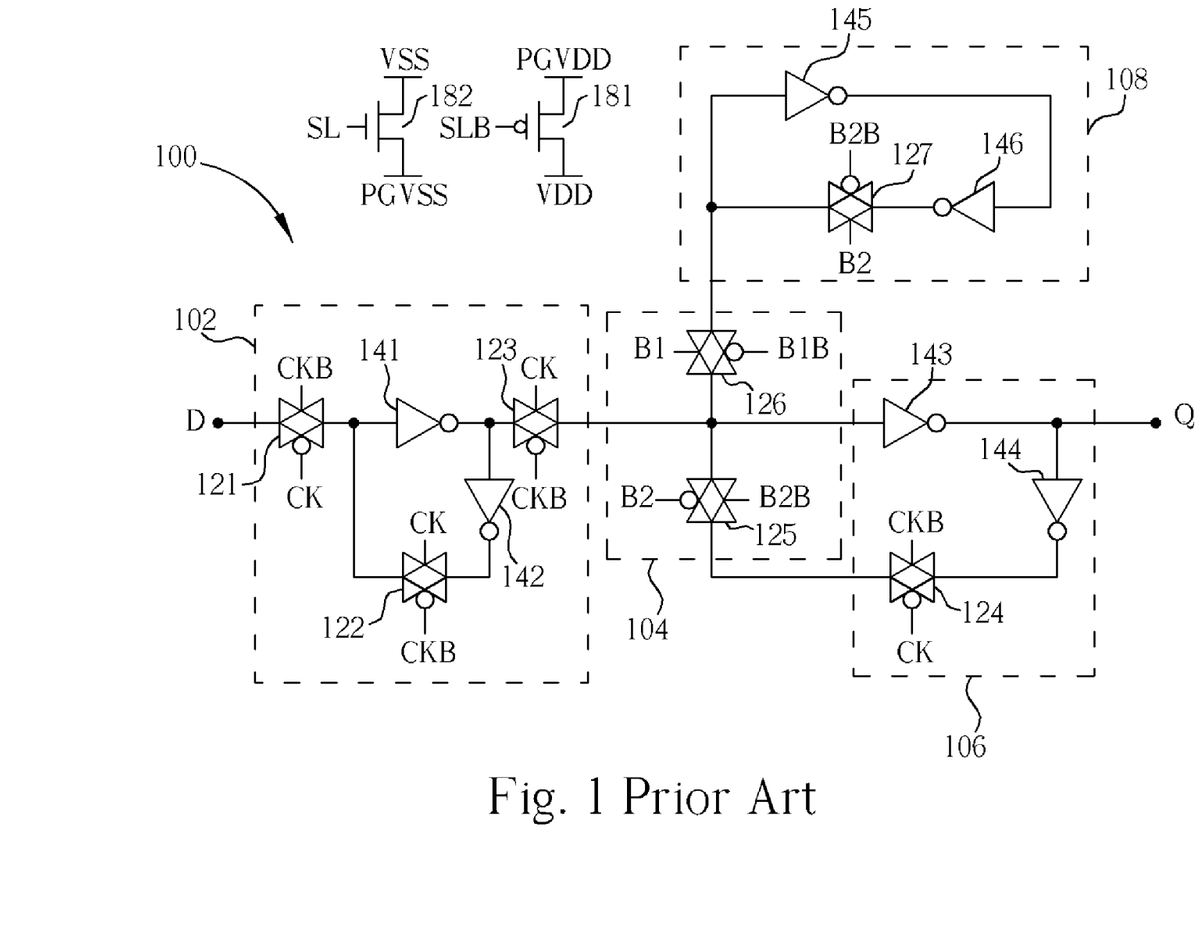
FIG. 1 shows a prior art data retention cell based on a balloon latch.

The balloon latch unit 108 is powered between the real supply voltage PGVDD and the real ground voltage PGVSS, which means that the balloon latch unit 108 is always powered for preserving data. The virtual supply voltage VDD is coupled to the real supply voltage PGVDD via a header sleep transistor 181 controlled by a sleep signal SLB, and the virtual ground voltage VSS is coupled to the real ground voltage via a footer sleep transistor 182 controlled by a sleep signal SL. The circuit elements excluding the balloon latch unit 108 are powered between the virtual supply voltage VDD and the virtual ground voltage VSS, between the virtual supply voltage VDD and the real ground voltage PGVSS, or between the real supply voltage PGVDD and the virtual ground voltage VSS. The plurality of transmission gates 121-127 are controlled respectively by control clocks CK, CKB and control signals B1, B1B, B2 and B2B. The data retention cell 100 requires an extra balloon latch unit 108 for data-preserving, and furthermore, complicated controlling and timing are required to transfer data signals back and forth between the balloon latch unit 108 and the master-slave flip-flop on any transition from the power-saving mode to the power-active mode or vice verse.

SUMMARY OF THE INVENTION

In accordance with an embodiment of the present invention, a data retention cell is provided for preserving an output data signal in a power-saving mode. The data retention cell comprises an input control circuit and a master-slave flip-flop. The input control circuit has a first input port for receiving an input data signal, a second input port for receiving a retention signal, a third input port for receiving a clock, a fourth input port for receiving a feedback signal, a first output port for outputting an internal input data signal, and a second output port for outputting an internal clock. The input control circuit comprises a delay unit having an input port coupled to the second input port of the input control circuit for receiving the retention signal and an output port. The master-slave flip-flop has a first input port coupled to the first output port of the input control circuit for receiving the internal input data signal, a second input port coupled to the second output port of the input control circuit for receiving the internal clock, a first output port for outputting the output data signal, and a second output port for outputting the feedback signal. The master-slave flip-flop comprises a master latch unit having an input port and an output port, and a slave latch unit having an input port and an output port. The slave latch unit is coupled to be powered between a real supply voltage and a real ground voltage, and the master latch unit is coupled to be powered by a virtual power.

The present invention further provides a data retention cell for preserving a complemented output data signal in a power-saving mode. The data retention cell comprises an input control circuit and a master-slave flip-flop. The input control circuit has a first input port for receiving an input data signal, a second input port for receiving a retention signal, a third input port for receiving a clock, a fourth input port for receiving a feedback signal, a first output port for outputting an internal input data signal, and a second output port for outputting a complemented internal clock. The input control circuit comprises a delay unit having an input port coupled to the second input port of the input control circuit for receiving the retention signal and an output port. The master-slave flip-flop has a first input port coupled to the first output port of the input control circuit for receiving the internal input data signal, a second input port coupled to the second output port of the input control circuit for receiving the complemented internal clock, a first output port for outputting the complemented output data signal, and a second output port for outputting the feedback signal. The master-slave flip-flop comprises a master latch unit having an input port and an output port, and a slave latch unit having an input port and an output port. The slave latch unit is coupled to be powered between a real supply voltage and a real ground voltage and the master latch unit is coupled to be powered by a virtual power.

Furthermore, the present invention provides a data retention method for preserving an output data signal of a data retention cell in a power-saving mode. The data retention cell includes an input control circuit and a master-slave flip-flop. The data retention method comprises powering a slave latch unit of the master-slave flip-flop with a real power, powering a mater latch unit of the mater-slave flip-flop with a virtual power, switching a retention signal furnished to the input control circuit from a disable state to an enable state when receiving a power-saving request, decoupling the virtual power from the real power, retaining the output data signal in the slave latch unit of the master-slave flip-flop, furnishing the output data signal backward to the input control circuit, coupling the virtual power to the real power when receiving a power-active request, forwarding the retained output data signal by the input control circuit to the master latch unit of the master-slave flip-flop, switching the retention signal from the enable state to the disable state, and delaying signal refreshing of the master latch unit by an input data signal through the input control circuit.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. For signal explanation, a logic state 1 is used to describe one logic state that assumes a high logic level, and a logic state 0 is used to describe the other logic state that assumes a low logic level. Here, it is to be noted that the present invention is not limited thereto.

Figure 2:
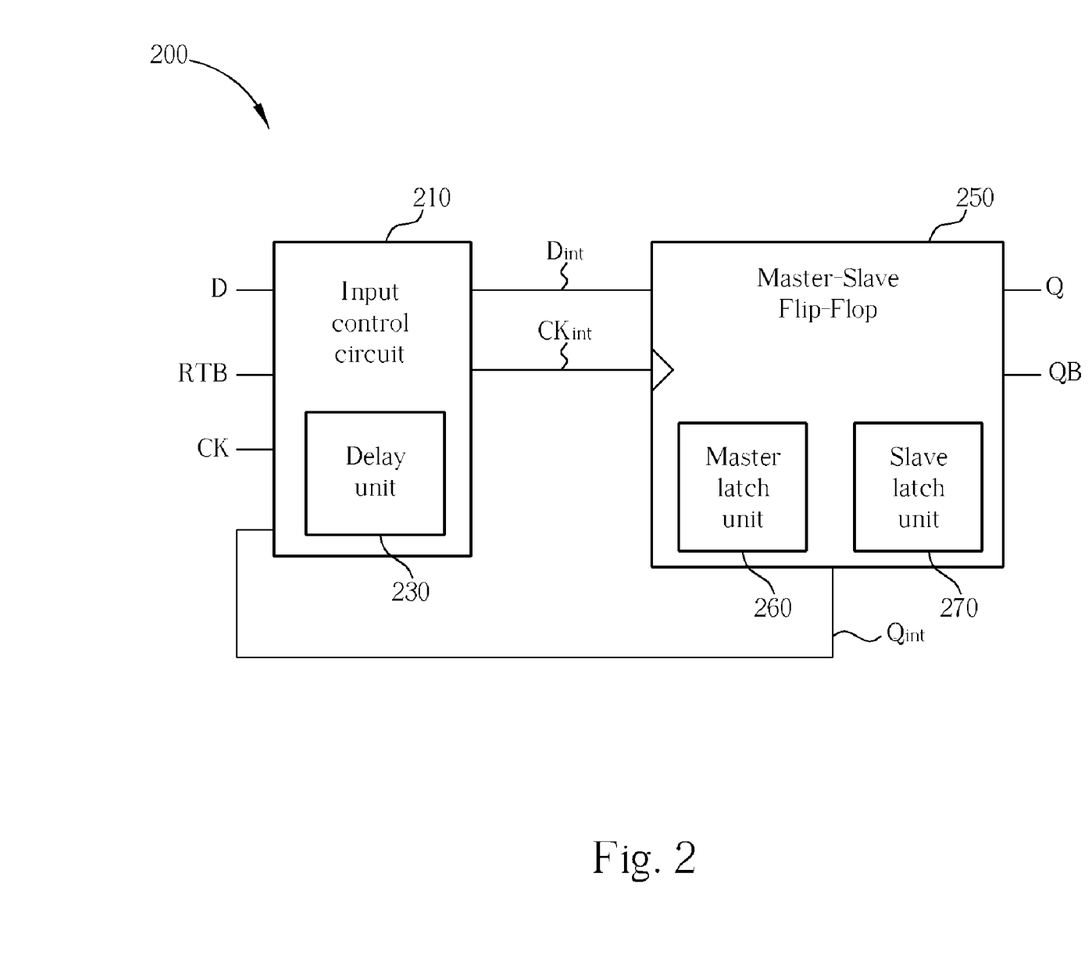
FIG. 2 is a block diagram schematically showing the structure of a data retention cell according to the present invention.

Please refer to FIG. 2, which is a block diagram schematically showing the structure of a data retention cell 200 according to the present invention. The data retention cell 200 comprises an input control circuit 210 and a master-slave flip-flop 250. The input control circuit 210 comprises a delay unit 210. The input control circuit 210 has a first input port for receiving an input data signal D, a second input port for receiving a retention signal RTB, a third input port for receiving a clock CK, a fourth input port for receiving a feedback signal Qint, a first output port for outputting an internal input data signal Dint, and a second output port for outputting an internal clock CKint.

The master-slave flip-flop 250 comprises a master latch unit 260 and a slave latch unit 270. The master-slave flip-flop 250 has a first input port coupled to the first output port of the input control circuit 210 for receiving the internal input data signal Dint, a second input port coupled to the second output port of the input control circuit 210 for receiving the internal clock CKint, a first output port for outputting an output data signal Q, a second output port for outputting a complemented output data signal QB, and a third output port coupled to the fourth input port of the input control circuit 210 for sending the feedback signal Qint backward to the input control circuit 210. The delay unit 210 may comprise a plurality of series-connected buffers or an even number of series-connected inverters.

In operation, the slave latch unit 270 is powered between a real power supply voltage and a real ground voltage, which means that the slave latch unit 270 is always powered for preserving data in the power-saving mode. The internal input data signal Dint is controlled to be switched between the input data signal D and the feedback signal Qint by the input control circuit 210 in response to the retention signal RTB. The internal input data signal Dint is retained to be the input data signal D when the retention signal RTB holds a disable state. The internal input data signal Dint is switched to become the feedback signal Qint when the retention signal RTB is switched to an enable state. The enable state of the retention signal RTB can be the logic state 0 for an active-low operation mode, or can be the logic state 1 for an active-high operation mode. However, the enable state of the retention signal RTB is assumed to be the logic state 0 hereinafter for the sake of unambiguous explanation.

The delay unit 230 functions to delay the switching of the internal input data signal Dint from the feedback signal Qint to the input data signal D or from the input data signal D to the feedback signal Qint when the retention signal RTB switches from the logic state 0 to the logic state 1 or vice verse. The clock CK is gated to generate the internal clock CKint by the input control circuit 210 based on the retention signal RTB. That is, the internal clock CKint becomes the clock CK when the retention signal RTB holds the logic state 1, and is retained in a retention state when the retention signal RTB holds the logic state 1. The retention state of the internal clock CKint is utilized to enable the slave latch unit 270 to preserve data in the power-saving mode.

Figure 3:
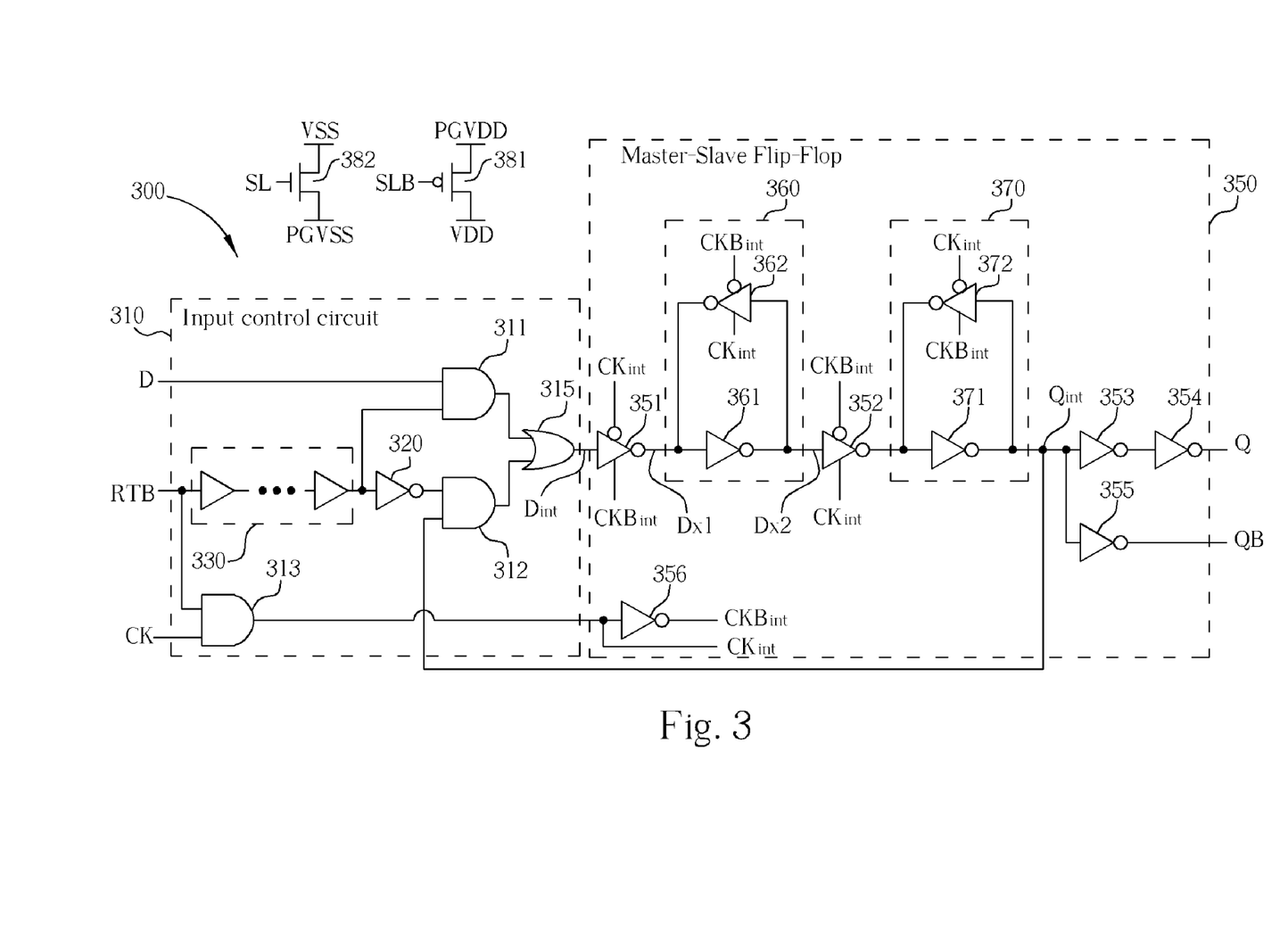
FIG. 3 is a circuit diagram schematically showing the structure of a data retention cell in accordance with a first preferred embodiment of the present invention.

Please refer to FIG. 3, which is a circuit diagram schematically showing the structure of a data retention cell 300 in accordance with a first preferred embodiment of the present invention. The data retention cell 300 comprises an input control circuit 310 and a master-slave flip-flop 350. The input control circuit 310 comprises a delay unit 330, an inverter 320, an OR gate 315, and three AND gates 311, 312 and 313. The input control circuit 310 has a first input port for receiving an input data signal D, a second input port for receiving a retention signal RTB, a third input port for receiving a clock CK, a fourth input port for receiving a feedback signal Qint, a first output port for outputting an internal input data signal Dint, and a second output port for outputting an internal clock CKint.

The data delay unit 330 has an input port coupled to the second input port of the input control circuit 310, and an output port. The inverter 320 has an input port coupled to the output port of the data delay unit 330, and an output port. The AND gate 311 has a first input port coupled to the output port of the delay unit 330, a second input port coupled to the first input port of the input control circuit 310, and an output port. The AND gate 312 has a first input port coupled to the output port of the inverter 320, a second input port coupled to the fourth input port of the input control circuit 310, and an output port. The OR gate 315 has a first input port coupled to the output port of the AND gate 311, a second input port coupled to the output port of the AND gate 312, and an output port coupled to the first output port of the input control circuit 310. The AND gate 313 has a first input port coupled to the second input port of the input control circuit 310, a second input port coupled to the third input port of the input control circuit 310, and an output port coupled to the second output port of the input control circuit 310.

The master-slave flip-flop 350 comprises two tri-state inverters 351, 352, four inverters 353-356, a master latch unit 360, and a slave latch unit 370. The master-slave flip-flop 350 has a first input port coupled to the first output port of the input control circuit 310 for receiving the internal input data signal Dint, a second input port coupled to the second output port of the input control circuit 310 for receiving the internal clock CKint, a first output port for outputting an output data signal Q, a second output port for outputting a complemented output data signal QB, and a third output port coupled to the fourth input port of the input control circuit 310 for sending the feedback signal Qint backward to the input control circuit 310.

The inverter 356 has an input port coupled to the second input port of the master-slave flip-flop 350 for receiving the internal clock CKint, and an output port for outputting a complemented internal clock CKBint. The tri-state inverter 351 has an enable input port coupled to the output port of the inverter 356, an inverted enable input port coupled to the second input port of the master-slave flip-flop 350, an input port coupled to the first input port of the master-slave flip-flop 350, and an output port. The master latch unit 360 has an input port coupled to the output port of the tri-state inverter 351, and an output port. The tri-state inverter 352 has an enable input port coupled to the second input port of the master-slave flip-flop 350, an inverted enable input port coupled to the output port of the inverter 356, an input port coupled to the output port of the master latch unit 360, and an output port. The slave latch unit 370 has an input port coupled to the output port of the tri-state inverter 352, and an output port. The inverters 353 and 354 are series-connected and coupled between the output port of the slave latch unit 370 and the first output port of the master-slave flip-flop 350. The inverter 355 is coupled between the output port of the slave latch unit 370 and the second output port of the master-slave flip-flop 350.

The master latch unit 360 comprises an inverter 361 and a tri-state inverter 362. The inverter 361 has an input port coupled to the output port of the tri-state inverter 351, and an output port coupled to the input port of the tri-state inverter 352. The tri-state inverter 362 has an enable input port coupled to the second input port of the master-slave flip-flop 350, an inverted enable input port coupled to the output port of the inverter 356, an output port coupled to the input port of the inverter 361, and an input port coupled to the output port of the inverter 361.

The slave latch unit 370 comprises an inverter 371 and a tri-state inverter 372. The inverter 371 has an input port coupled to the output port of the tri-state inverter 352, and an output port coupled to the output port of the slave latch unit 370. The tri-state inverter 372 has an enable input port coupled to the output port of the inverter 356, an inverted enable input port coupled to the second input port of the master-slave flip-flop 350, an output port coupled to the input port of the inverter 371, and an input port coupled to the output port of the inverter 371. While operating in the power-saving mode, the output port of the inverter 371 preserves the output data signal Q, and the output port of the tri-state inverter 372 preserves the complemented output data signal QB. In another embodiment, the second output port of the master-slave flip-flop 350 can be coupled to the output port of the tri-state inverter 372 for receiving the complemented output data signal QB via a plurality of buffers or via an even number of inverters.

The delay unit 330 comprises a plurality of series-connected buffers for providing a delay process during the transfer of the retention signal RTB to the input ports of the inverter 320 and the AND gate 311. The AND gate 311 receives an input data signal D and the delayed retention signal RTB for outputting a first AND signal to the first input port of the OR gate 315. The AND gate 312 receives a feedback signal Qint and the delayed retention signal RTB for outputting a second AND signal to the second input port of the OR gate 315. The OR gate 315 receives the first and the second AND signals from the AND gates 311, 312 for outputting the internal input data signal Dint. The AND gate 313 receives the clock CK and the retention signal RTB for outputting the internal clock CKint, which provides clock-gating functionality for the data retention cell 300. The inverters 353, 354 are utilized to provide the output data signal Q having high driving capability. The inverter 355 is utilized to provide the complemented output data signal QB having high driving capability.

The AND gate 313, the tri-state inverter 372 and the inverters 356, 371 are powered between the real supply voltage PGVDD and the real ground voltage PGVSS for preserving data in the power-saving mode. That is, when the data retention cell is operated in the power-saving mode, the internal clock CKint having the logic state 0 and the complemented internal clock CKBint having the logic state 1 are furnished to enable the tri-state inverter 372, and the tri-state inverter 372 in conjunction with the inverter 371 performs a latching operation to preserve the output data signal Q.

The virtual supply voltage VDD is coupled to the real supply voltage PGVDD via a header sleep transistor 381 controlled by a sleep signal SLB, and the virtual ground voltage VSS is coupled to the real ground voltage PGVSS via a footer sleep transistor 382 controlled by a sleep signal SL. The circuit elements excluding the AND gate 313, the tri-state inverter 372 and the inverters 356, 371 are powered between the virtual supply voltage VDD and the virtual ground voltage VSS, between the virtual supply voltage VDD and the real ground voltage PGVSS, or between the real supply voltage PGVDD and the virtual ground voltage VSS.

Figure 4:
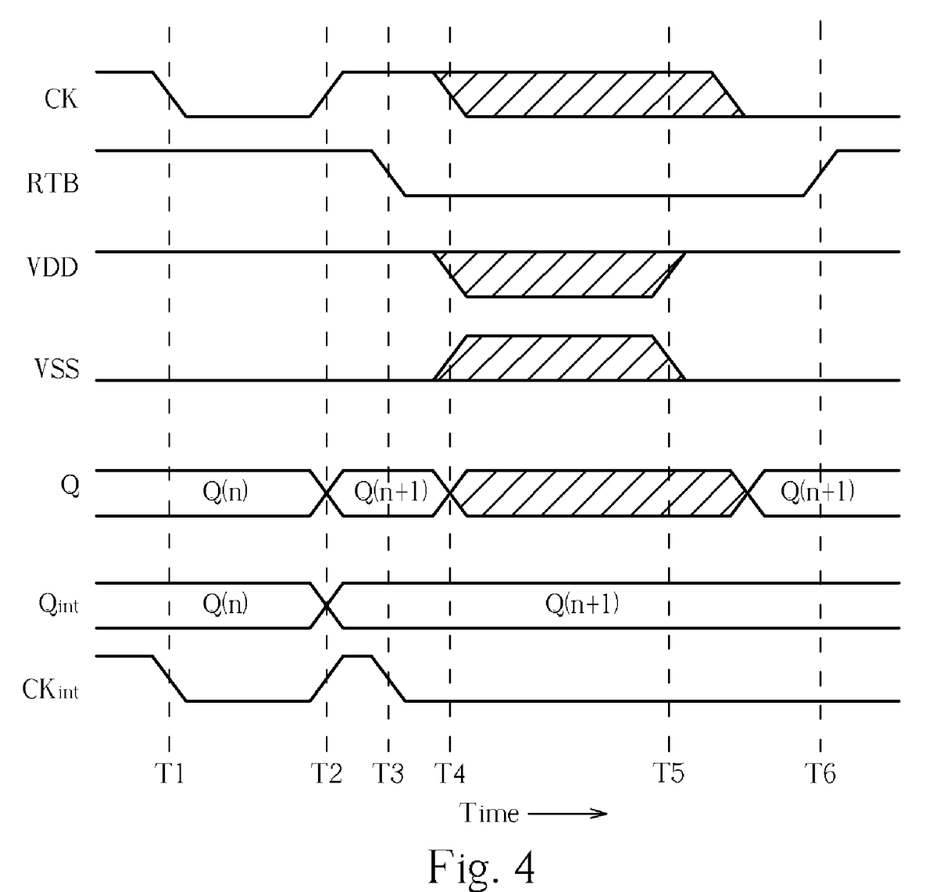
FIG. 4 is a timing diagram showing related signals concerning the operation of the data retention cell in FIG. 3.

Please refer to FIG. 4, which is a timing diagram showing related signals concerning the operation of the data retention cell 300, having time along the abscissa. The signals in FIG. 4, from top to bottom, are the clock CK, the retention signal RTB, the virtual supply voltage VDD, the virtual ground voltage VSS, the output data signal Q, the feedback signal Qint, and the internal clock CKint.

In normal operation, when the retention signal RTB holds the logic state 1, the retention cell 300 functions to operate as a normal master-slave flip-flop, and the internal input data signal Dint is retained to be the input data signal D. When the clock CK switches from the logic state 1 to the logic state 0 at time T1, the tri-state inverters 351, 372 are enabled, and the tri-state inverters 362, 352 are disabled. The tri-state inverter 351 inverts the internal input data signal Dint for generating a first internal data signal Dx1, which is furnished to the input port of the master latch unit 360. The inverter 361 inverts the first internal data signal Dx1 for generating a second internal data signal Dx2, which is forwarded to the input port of the tri-state inverter 352. However, the tri-state inverter 352 is disabled at the moment, and the second internal data signal Dx2 cannot be inverted and transferred to the slave latch unit 370. The tri-state inverters 372 and the inverter 371 perform the latching operation to retain the current output data signal Q(n), which means that the master-slave flip-flop 350 is operated in the memory state.

Thereafter, when the clock CK switches from the logic state 0 to the logic state 1 at time T2, the tri-state inverters 351, 372 are disabled, and the tri-state inverters 362, 352 are enabled. The input data signal D cannot be inverted and transferred to the master latch unit 360 for refreshing. The tri-state inverter 362 and the inverter 361 perform the latching operation to retain the second internal data signal Dx2, which is transferred to become a data signal Q(n+1) via the enabled tri-state inverter 352 and the inverter 371. Consequently, the output data signal Q and the feedback signal Qint both turn out to be the data signal Q(n+1).

When the retention signal RTB switches from the logic state 1 to the logic state 0 at time T3, the internal clock CKint is decoupled from the clock CK and is forced to hold the logic state 0. Accordingly, the complemented internal clock CKBint is forced to hold the logic state 1. Therefore, the tri-state inverters 351, 372 are enabled, and the inverters 362, 352 are disabled. The tri-state inverter 372 and the inverter 371 perform the latching operation for retaining the data signal Q(n+1). Besides, the internal input data signal Dint is now switched to become the data signal Q(n+1) due to the feedback operation controlled by the input control circuit 310 in response to the retention signal RTB, and the master latch unit 360 is refreshed by the data signal Q(n+1).

When the power-saving operation is initiated at time T4, the virtual supply voltage VDD and the virtual ground voltage VSS are decoupled from the real supply voltage PGVDD and the real ground voltage PGVSS respectively by turning off the sleep transistors 381, 382, which are shown in the regions drawn as slash. The circuit elements excluding the AND gate 313, the tri-state inverter 372 and the inverters 356, 371 are inactive, and the output data signal Q is floated as shown in the region drawn as slash. However, the inverters 371 and the tri-state inverter 372 are still powered to perform the latching operation for retaining the data signal Q(n+1).

Subsequently, when the virtual supply voltage VDD and the virtual ground voltage VSS are again coupled to the real supply voltage PGVDD and the real ground voltage PGVSS respectively by turning on the sleep transistors 381, 382 at time T5, the output data signal Q becomes the data signal Q(n+1) again after a short delay due to the delay caused by the switching from the power-saving operation to the power-active operation, which means that the data signal Q(n+1) is preserved during the power-saving operation. Because the retention signal RTB still holds the logic state 0 at the moment, the internal input data signal Dint becomes the data signal Q(n+1) again due to the power-active operation.

When the retention signal RTB switches from the logic state 0 to the logic state 1 at time T6, the internal clock CKint is coupled to the clock CK again, and the internal input data signal Dint will switch to become the input data signal D. However, because of the delay unit 330, the internal input data signal Dint is not able to switch from the data signal Q(n+1) to the input data signal D immediately after the time T6. That is, the switching of the internal input data signal Dint from the data signal Q(n+1) to the input data signal D is delayed for a time period caused by the delay unit 330. Consequently, the input data signal D is not able to refresh the master-slave flip-flop 350 immediately after the switching of the retention signal RTB from the logic state 0 to the logic state 1, and the data-preserving process can be operated properly when the power-saving operation is finished.

Figure 5:
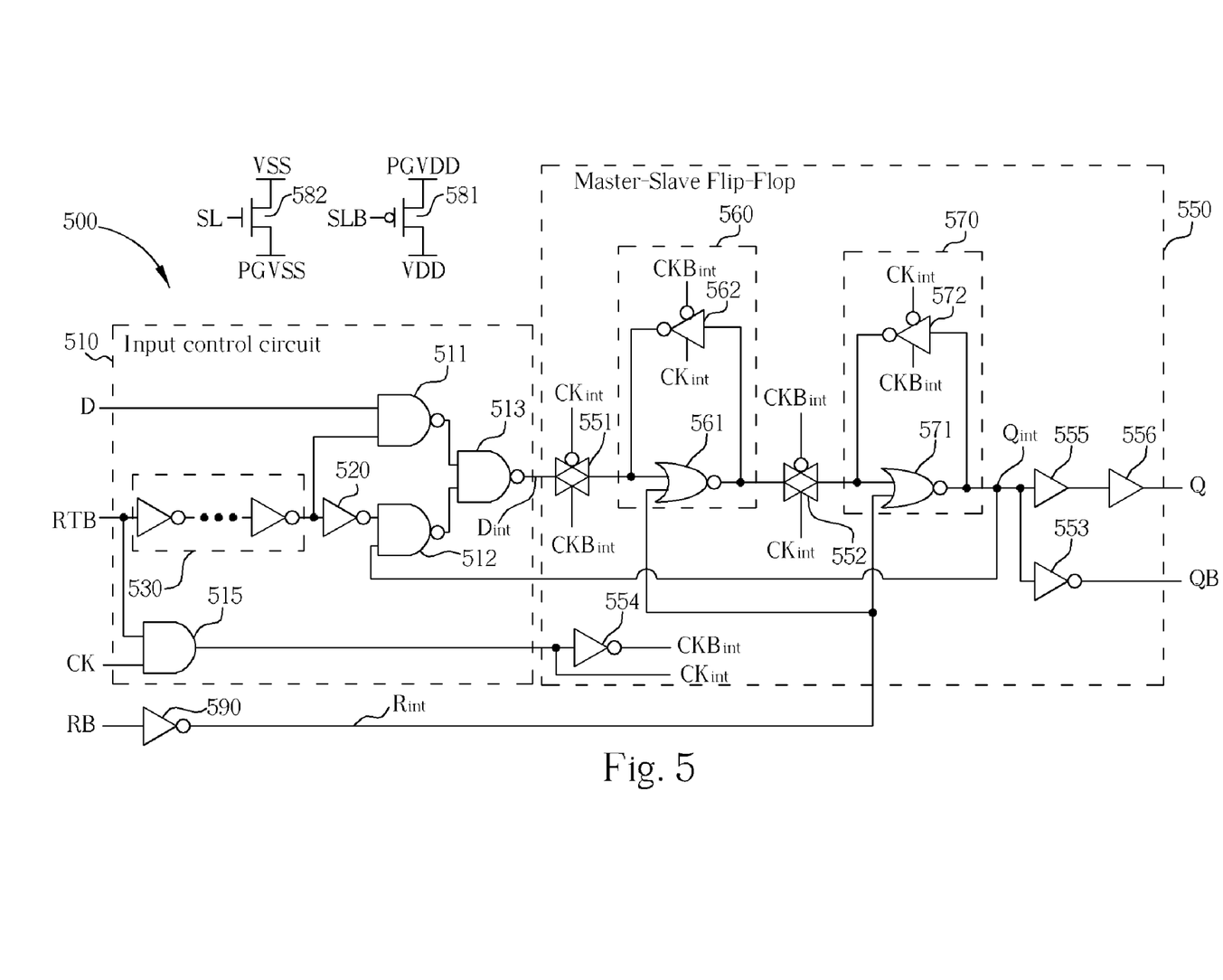
FIG. 5 is a circuit diagram schematically showing the structure of a data retention cell in accordance with a second preferred embodiment of the present invention.

Please refer to FIG. 5, which is a circuit diagram schematically showing the structure of a data retention cell 500 in accordance with a second preferred embodiment of the present invention. The data retention cell 500 comprises an input control circuit 510, a master-slave flip-flop 550, and an inverter 590. The input control circuit 510 comprises a delay unit 530, an inverter 520, an AND gate 515, and three NAND gates 511, 512, and 513. The connections of the circuit elements of the input control circuit 510 is similar to the connections of the circuit elements of the input control circuit 310, and for the sake of brevity, further detailed description on the connections of the circuit elements of the input control circuit 510 is omitted. The delay unit 530 comprises an even number of series-connected inverters for providing a delay process during the transfer of a retention signal RTB to the input ports of the inverter 520 and the NAND gate 511. The NAND gate 511 receives an input data signal D and the delayed retention signal RTB for outputting a first NAND signal to one input port of the NAND gate 513. The NAND gate 512 receives a feedback signal Qint and the delayed retention signal RTB for outputting a second NAND signal to the other input port of the NAND gate 513. The NAND gate 513 receives the first and the second NAND signals from the NAND gates 511, 512 for outputting an internal input data signal Dint. The AND gate 515 receives a clock CK and the retention signal RTB for outputting an internal clock CKint, which provides clock-gating functionality for the data retention cell 500.

The master-slave flip-flop 550 comprises two transmission gates 551, 552, two inverters 553, 554, two buffers 555, 556, a master latch unit 560, and a slave latch unit 570. Except for the resetting connections concerning the inverter 590, which will be described later, the other connections of the circuit elements of the master-slave flip-flop 550 are similar to the connections of the circuit elements of the master-slave flip-flop 350, and for the sake of brevity, further detailed description on the other connections of the circuit elements of the master-slave flip-flop 550 is also omitted.

The inverter 554 inverts the internal clock CKint for generating a complemented internal clock CKBint. The transmission gates 551, 552 having enable inputs and inverted enable inputs are used to control transmission of data signals based on the internal clock CKint and the complemented internal clock CKBint. The buffers 555, 556 are utilized to provide an output data signal Q having high driving capability. The inverter 553 is utilized to provide a complemented output data signal QB having high driving capability. The inverter 590 has an input port coupled to receive a reset signal RB and inverts the reset signal RB for generating an internal reset signal Rint at an output port.

The master latch unit 560 comprises a NOR gate 561 and a tri-state inverter 562, and the slave latch unit 570 comprises a NOR gate 571 and a tri-state inverter 572. The NOR gates 561, 571 have input ports coupled to the output port of the inverter 590 for receiving the internal reset signal Rint so as to perform a resetting operation. When the reset signal RB is switched to the logic state 0, the internal reset signal Rint becomes the logic state 1, and the output data signal Q is reset to become the logic state 0. However, when the reset signal RB holds the logic state 1, the NOR gates 561, 571 function to operate as the inverters 361, 371 shown in FIG. 3.

The feedback signal Qint is outputted from the slave latch unit 570 and is furnished backward to the input control circuit 510. The AND gate 515, the NOR gate 571, the tri-state inverter 572 and the inverters 554, 590 are powered between the real supply voltage PGVDD and the real ground voltage PGVSS for preserving data in the power-saving mode. Similarly, the virtual supply voltage VDD is coupled to the real supply voltage PGVDD via a header sleep transistor 581 controlled by a sleep signal SLB, and the virtual ground voltage VSS is coupled to the real ground voltage PGVSS via a footer sleep transistor 582 controlled by a sleep signal SL. The circuit elements excluding the AND gate 515, the NOR gate 571, the tri-state inverter 572 and the inverters 554, 590 are powered between the virtual supply voltage VDD and the virtual ground voltage VSS, between the virtual supply voltage VDD and the real ground voltage PGVSS, or between the real supply voltage PGVDD and the virtual ground voltage VSS.

Except for the resetting operation concerning the reset signal RB, other operations of the data retention cell 500 are similar to the operations of the data retention cell 300, and for the sake of brevity, further discussion is omitted.

Figure 6:
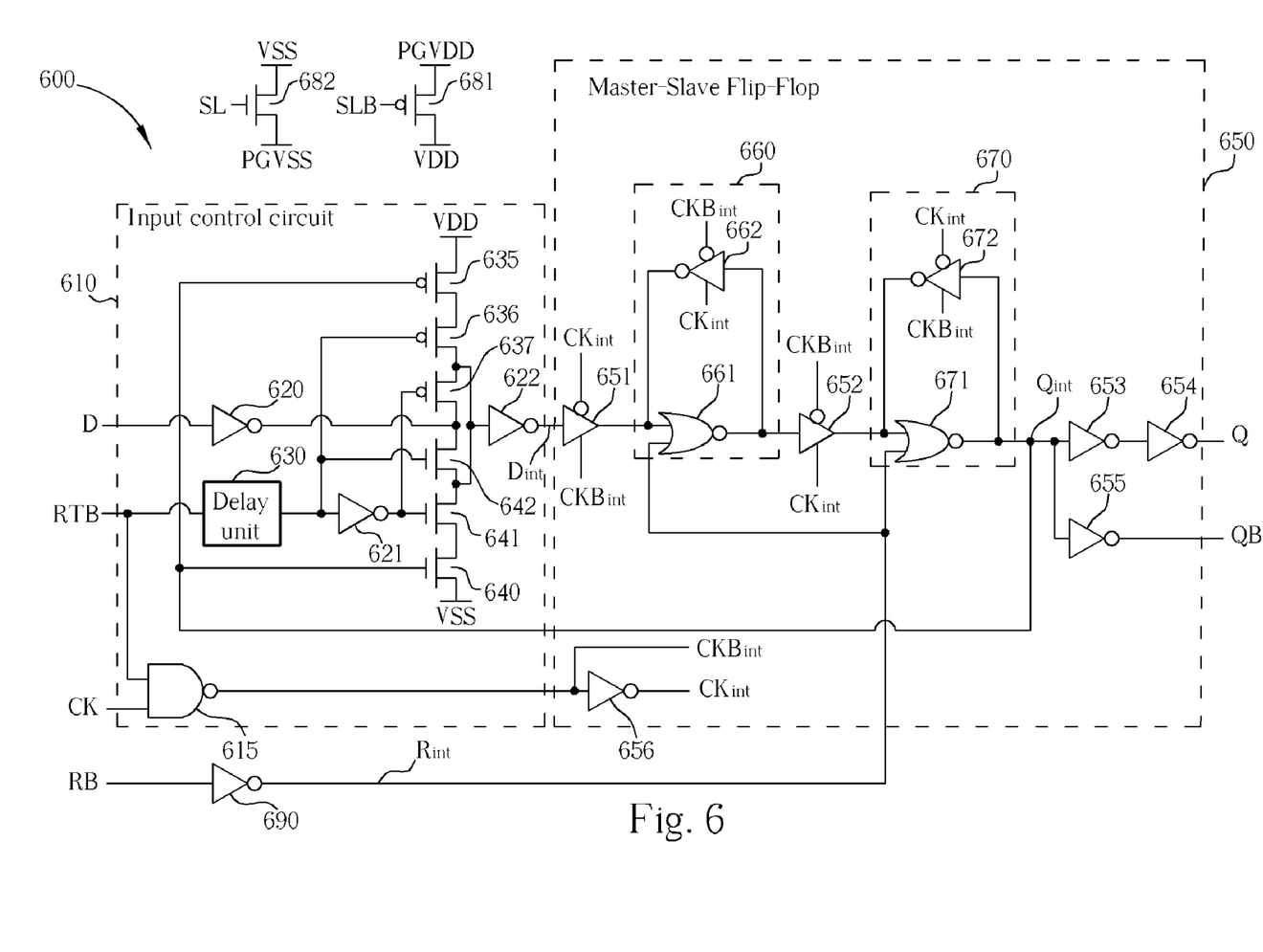
FIG. 6 is a circuit diagram schematically showing the structure of a data retention cell in accordance with a third preferred embodiment of the present invention.

Please refer to FIG. 6, which is a circuit diagram schematically showing the structure of a data retention cell 600 in accordance with a third preferred embodiment of the present invention. The data retention cell 600 comprises an input control circuit 610, a master-slave flip-flop 650, and an inverter 690. The input control circuit 610 comprises a delay unit 630, three inverters 620, 621 and 622, a NAND gate 615, three PMOS transistors 635, 636 and 537, and three NMOS transistors 640, 641 and 642.

The input control circuit 610 has a first input port for receiving an input data signal D, a second input port for receiving a retention signal RTB, a third input port for receiving a clock CK, a fourth input port for receiving a feedback signal Qint, a first output port for outputting an internal input data signal Dint, and a second output port for outputting a complemented internal clock CKBint.

The data delay unit 630 has an input port coupled to the second input port of the input control circuit 610, and an output port. The inverter 621 has an input port coupled to the output port of the delay unit 630, and an output port. The inverter 620 has an input port coupled to the first input port of the input control circuit 610, and an output port. The inverter 622 has an output port coupled to the first output port of the input control circuit 610 and an input port.

The PMOS transistor 635 has a gate coupled to the fourth input port of the input control circuit 610, a first terminal coupled to receive a virtual supply voltage VDD, and a second terminal. The PMOS transistor 636 has a gate coupled to the output port of the delay unit 630, a first terminal coupled to the second terminal of the PMOS transistor 635, and a second terminal coupled to the input port of the inverter 622. The PMOS transistor 637 has a gate coupled to the output port of the inverter 621, a first terminal coupled to the input port of the inverter 622, and a second terminal coupled to the output port of the inverter 620.

The NMOS transistor 640 has a gate coupled to the gate of the PMOS transistor 635, a first terminal coupled to receive a virtual ground voltage VSS, and a second terminal. The NMOS transistor 641 has a gate coupled to the output port of the inverter 621, a first terminal coupled to the second terminal of the NMOS transistor 640, and a second terminal coupled to the input port of the inverter 622. The NMOS transistor 642 has a gate coupled to the output port of the delay unit 630, a first terminal coupled to the input port of the inverter 622, and a second terminal coupled to the output port of the inverter 620. The NAND gate 615 has a first input port coupled to the second input port of the input control circuit 610, a second input port coupled to the third input port of the input control circuit 610 for receiving the clock CK, and an output port coupled to the second output port of the input control circuit 610 for outputting the complemented internal clock CKBint.

The delay unit 630 may comprise a plurality of series-connected buffers or an even number of series-connected inverters for providing a delay process during the transfer of the retention signal RTB to the input port of the inverter 621 and to the gate of the PMOS transistor 636.

When the retention signal RTB holds the logic state 0, the PMOS transistor 636 and the NMOS transistor 641 are turned on, and the PMOS transistor 635 in conjunction with the NMOS transistor 640 functions to operate as an inverter for inverting the feedback signal Qint, which results in switching the internal input data signal Dint to become the feedback signal Qint. When the retention signal RTB holds the logic state 1, the PMOS transistor 637 and the NMOS transistor 642 are turned on for data signal transmission, which results in switching the internal input data signal Dint to become the input data signal D. Furthermore, the delay unit 630 functions to delay the switching of the internal input data signal Dint from the feedback signal Qint to the input data signal D or from the input data signal D to the feedback signal Qint when the retention signal RTB switches from the logic state 0 to the logic state 1 or vice verse. The NAND gate 615 receives the clock CK and the retention signal RTB for outputting the complemented internal clock CKBint, which provides clock-gating functionality for the data retention cell 600.

The master-slave flip-flop 650 comprises two tri-state buffers 651, 652, four inverters 653-656, a master latch unit 660, and a slave latch unit 670. The master-slave flip-flop 650 has a first input port coupled to the first output port of the input control circuit 610 for receiving the internal input data signal Dint, a second input port coupled to the second output port of the input control circuit 310 for receiving the complemented internal clock CKBint, a first output port for outputting an output data signal Q, a second output port for outputting a complemented output data signal QB, and a third output port coupled to the fourth input port of the input control circuit 610 for sending the feedback signal Qint backward to the input control circuit 610.

The inverter 656 has an input port coupled to the second input port of the master-slave flip-flop 650 for receiving the complemented internal clock CKBint, and an output port for outputting an internal clock CKint. The tri-state buffer 651 has an enable input port coupled to the second input port of the master-slave flip-flop 650, and an inverted enable input port coupled to the output port of the inverter 656. The tri-state buffer 652 has an enable input port coupled to the output port of the inverter 656, and an inverted enable input port coupled to the second input port of the master-slave flip-flop 650. The tri-state buffers 651, 652 function to operate as transmission gates for controlling transmission of data signals. The inverters 653, 654 coupled between the slave latch unit 670 and the first output port of the master-slave flip-flop 650 are utilized to provide the output data signal Q having high driving capability. The inverter 655 coupled between the slave latch unit 670 and the second output port of the master-slave flip-flop 650 is utilized to provide the complemented output data signal QB having high driving capability. The inverter 690 is utilized to invert a reset signal RB for generating an internal reset signal Rint. The connections and functional operations concerning the inverter 690 is similar to the connections and functional operations concerning the inverter 590 in FIG. 5, and for the sake of brevity, further discussion on the inverter 690 is omitted.

The master latch unit 660 comprises a NOR gate 661 and a tri-state inverter 662, and the slave latch unit 670 comprises a NOR gate 671 and a tri-state inverter 672. The tri-state inverter 662 has an enable input port coupled to the output port of the inverter 656, and an inverted enable input port coupled to the second input port of the master-slave flip-flop 650. The tri-state inverter 672 has an enable input port coupled to the second input port of the master-slave flip-flop 650, an inverted enable input port coupled to the output port of the inverter 656, an input port coupled to the an output port of the NOR gate 671, and an output port coupled to one input port of the NOR gate 671. The other connections of the circuit elements of the master-slave flip-flop 650 are similar to the connections of the circuit elements of the master-slave flip-flop 550, and for the sake of brevity, further detailed description on the other connections of the circuit elements of the master-slave flip-flop 650 is also omitted. While operating in the power-saving mode, the output port of the NOR gate 671 preserves the output data signal Q, and the output port of the tri-state inverter 672 preserves the complemented output data signal QB. In another embodiment, the second output port of the master-slave flip-flop 650 can be coupled to the output port of the tri-state inverter 672 for receiving the complemented output data signal QB via a plurality of buffers or via an even number of inverters.

The feedback signal Qint is outputted from the slave latch unit 670 and is furnished backward to the input control circuit 610. The NAND gate 615, the NOR gate 671, the tri-state inverter 672 and the inverters 656, 690 are powered between the real supply voltage PGVDD and the real ground voltage PGVSS for preserving data in the power-saving mode. Similarly, the virtual supply voltage VDD is coupled to the real supply voltage PGVDD via a header sleep transistor 681 controlled by a sleep signal SLB, and the virtual ground voltage VSS is coupled to the real ground voltage PGVSS via a footer sleep transistor 682 controlled by a sleep signal SL. The circuit elements excluding the NAND gate 615, the NOR gate 671, the tri-state inverter 672 and the inverters 656, 690 are powered between the virtual supply voltage VDD and the virtual ground voltage VSS, between the virtual supply voltage VDD and the real ground voltage PGVSS, or between the real supply voltage PGVDD and the virtual ground voltage VSS. Except for the internal operation of the input control circuit 610 described above, other operations of the data retention cell 600 are similar to the operations of the data retention cell 500, and for the sake of brevity, further discussion is omitted.

Figure 7:
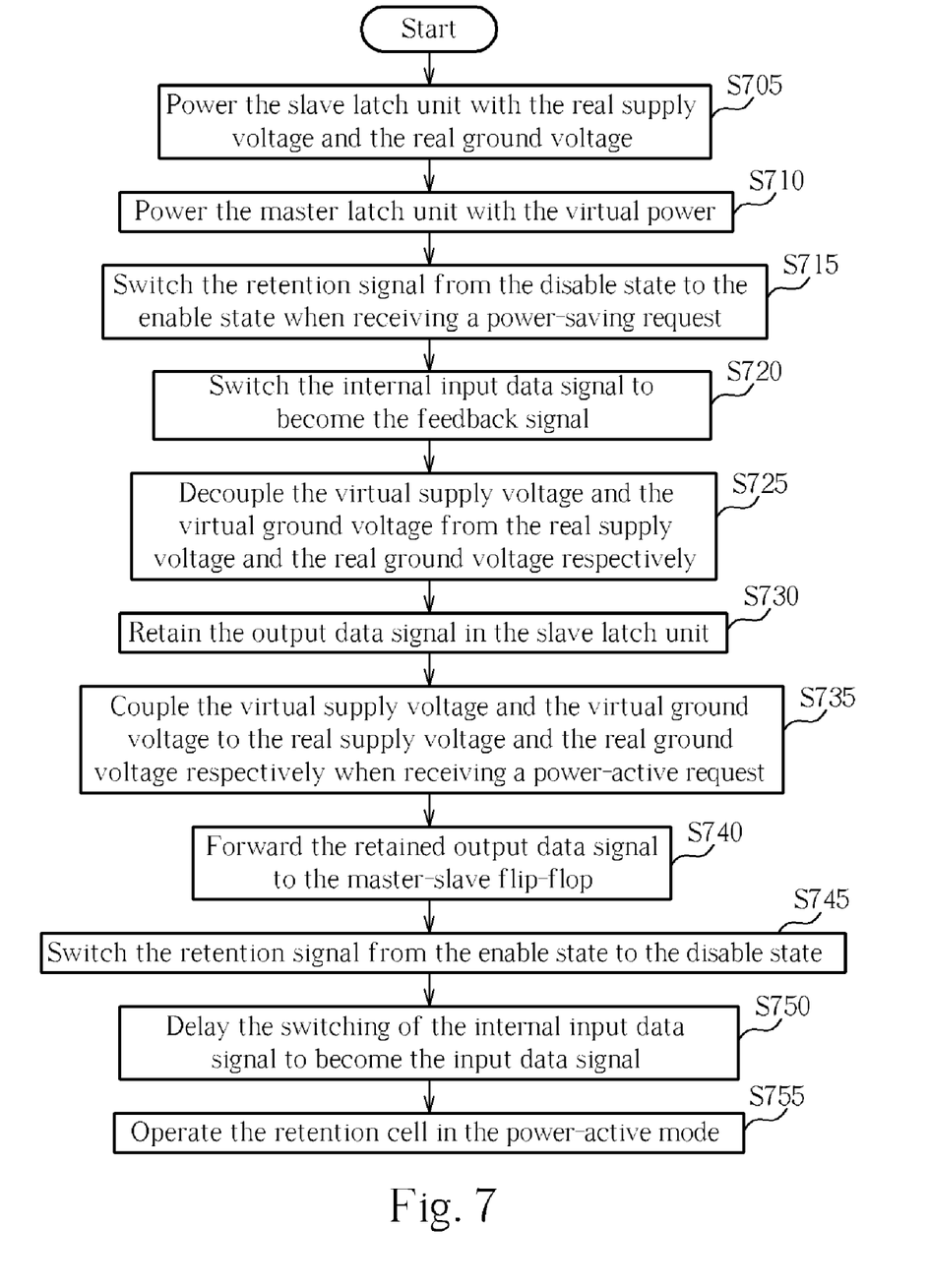
FIG. 7 is a flowchart depicting a data retention method concerning the power-saving operation based on the data retention cell in FIG. 3.

Please refer to FIG. 7, which is a flowchart depicting a data retention method concerning the power-saving operation based on the data retention cell 300. The data retention method comprises the following steps:

Step S705: power the slave latch unit 370 with the real supply voltage PGVDD and the real ground voltage PGVSS;

Step S710: power the master latch unit 360 with the virtual power;

Step S715: switch the retention signal RTB from the disable state to the enable state when receiving a power-saving request;

Step S720: switch the internal input data signal Dint to become the feedback signal Qint, which is the current output data signal Q to be retained;

Step S725: turn off the header sleep transistor 381 and the footer sleep transistor 382 for decoupling the virtual supply voltage VDD and the virtual ground voltage VSS from the real supply voltage PGVDD and the real ground voltage PGVSS respectively;

Step S730: retain the output data signal Q in the slave latch unit 370;

Step S735: turn on the header sleep transistor 381 and the footer sleep transistor 382 for coupling the virtual supply voltage VDD and the virtual ground voltage VSS to the real supply voltage PGVDD and the real ground voltage PGVSS when receiving a power-active request respectively;

Step S740: forward the retained output data signal Q to the first input port of the master-slave flip-flop 350 by the input control circuit 310 so that the internal input data signal Dint becomes the retained output data signal Q again;

Step S745: switch the retention signal RTB from the enable state to the disable state;

Step S750: delay the switching of the internal input data signal Dint to become the input data signal D, which means to delay signal refreshing of the master latch unit 360 by the input data signal D; and Step S755: operate the retention cell 350 in the power-active mode.

In the data retention method described above, the step serial numbers are not meant thereto limit the operating sequence, and any rearrangement of the operating sequence for achieving same functionality is still within the spirit and scope of the invention. For instance, the operating sequence between the steps S705 and S710 is optional. That is, the step S705 can be performed before or after the step S710 without affecting the functionality of the data retention method.

Furthermore, in the step S710, power the master latch unit 360 with the virtual power comprises power master latch unit 360 between the virtual supply voltage VDD and the virtual ground voltage VSS, between the virtual supply voltage VDD and the real ground voltage PGVSS, or between the real supply voltage PGVDD and the virtual ground voltage VSS.

In summary, by taking advantage of clock-gating and feedback mechanism in conjunction with a delay operation, the data retention cell and the data retention method of the present invention for data-preserving in the power-saving mode is achieved without the requirement of an extra balloon latch unit. Furthermore, complicated controlling and timing are not required for operating the transition from the power-saving mode to the power-active mode or vice verse.

Those skilled in the art will readily observe that numerous modifications and alterations of the device and method may be made while retaining the teachings of the invention.

What is claimed is:

1. A data retention cell for preserving an output data signal in a power-saving mode comprising:
   an input control circuit having a first input port for receiving an input data signal, a second input port for receiving a retention signal, a third input port for receiving a clock, a fourth input port for receiving a feedback signal, a first output port for outputting an internal input data signal, and a second output port for outputting an internal clock, the input control circuit comprising a delay unit, the delay unit having an input port coupled to the second input port of the input control circuit for receiving the retention signal and an output port; and
   a master-slave flip-flop having a first input port coupled to the first output port of the input control circuit for receiving the internal input data signal, a second input port coupled to the second output port of the input control circuit for receiving the internal clock, a first output port for outputting the output data signal, and a second output port for outputting the feedback signal, the master-slave flip-flop comprising a master latch unit having an input port and an output port, and a slave latch unit having an input port and an output port, wherein the slave latch unit is coupled to be powered between a real supply voltage and a real ground voltage and the master latch unit is coupled to be powered by a virtual power.

2. The data retention cell of claim 1, wherein the delay unit comprises at least one buffer, the buffer being coupled to be powered by the virtual power.

3. The data retention cell of claim 1, wherein the delay unit comprises at least two series-connected inverters, the inverters being coupled to be powered by the virtual power.

4. The data retention cell of claim 1, wherein the master latch unit is coupled to be powered between a virtual supply voltage and a virtual ground voltage, between the virtual supply voltage and the real ground voltage, or between the real supply voltage and the virtual ground voltage.

5. The data retention cell of claim 1, wherein the input control circuit further comprises:
    an inverter having an input port coupled to the output port of the delay unit, and an output port, the inverter being coupled to be powered by the virtual power;
    a first AND gate having a first input port coupled to the output port of the delay unit, a second input port coupled to the first input port of the input control circuit, and an output port, the first AND gate being coupled to be powered by the virtual power;
    a second AND gate having a first input port coupled to the output port of the inverter, a second input port coupled to the fourth input port of the input control circuit, and an output port, the second AND gate being coupled to be powered by the virtual power;
    an OR gate having a first input port coupled to the output port of the first AND gate, a second input port coupled to the output port of the second AND gate, and an output port coupled to the first output port of the input control circuit, the OR gate being coupled to be powered by the virtual power; and
    a third AND gate having a first input port coupled to the second input port of the input control circuit, a second input port coupled to the third input port of the input control circuit, and an output port coupled to the second output port of the input control circuit, the third AND gate being coupled to be powered between the real supply voltage and the real ground voltage.

6. The data retention cell of claim 1, wherein the master-slave flip-flop further comprises:
    a first inverter having an input port coupled to the second input port of the master-slave flip-flop for receiving the internal clock, and an output port for outputting a complemented internal clock, the first inverter being coupled to be powered between the real supply voltage and the real ground voltage;
    a first tri-state inverter having an enable input port coupled to the output port of the first inverter, an inverted enable input port coupled to the second input port of the master-slave flip-flop, an output port coupled to the input port of the master latch unit, and an input port coupled to the first input port of the master-slave flip-flop, the first tri-state inverter being coupled to be powered by the virtual power;
    a second tri-state inverter having an enable input port coupled to the second input port of the master-slave flip-flop, an inverted enable input port coupled to the output port of the first inverter, an output port coupled to the input port of the slave latch unit, and an input port coupled to the output port of the master latch unit, the second tri-state inverter being coupled to be powered by the virtual power.

7. The data retention cell of claim 6, wherein the master latch unit comprises:
    a second inverter having an input port coupled to the output port of the first tri-state inverter, and an output port coupled to the input port of the second tri-state inverter, the second inverter being coupled to be powered by the virtual power; and
    a third tri-state inverter having an enable input port coupled to the second input port of the master-slave flip-flop, an inverted enable input port coupled to the output port of the first inverter, an output port coupled to the output port of the first tri-state inverter, and an input port coupled to the input port of the second tri-state inverter, the third tri-state inverter being coupled to be powered by the virtual power.

8. The data retention cell of claim 6, wherein the slave latch unit comprises:
    a second inverter having an input port coupled to the output port of the second tri-state inverter, and an output port coupled to the first and the second output ports of the master-slave flip-flop, the second inverter being coupled to be powered between the real supply voltage and the real ground voltage; and
    a third tri-state inverter having an enable input port coupled to the output port of the first inverter, an inverted enable input port coupled to the second input port of the master-slave flip-flop, an output port coupled to the input port of the second inverter, and an input port coupled to the output port of the second inverter, the third tri-state inverter being coupled to be powered between the real supply voltage and the real ground voltage.

9. The data retention cell of claim 1, wherein the master-slave flip-flop further comprises at least one buffer coupled between the output port of the slave latch unit and the first output port of the master-slave flip-flop, the buffer being coupled to be powered by the virtual power.

10. The data retention cell of claim 1, wherein the master-slave flip-flop further comprises at least two series-connected inverters coupled between the output port of the slave latch unit and the first output port of the master-slave flip-flop, the series-connected inverters being coupled to be powered by the virtual power.

11. The data retention cell of claim 1, wherein the master-slave flip-flop further comprises a third output port for outputting a complemented output data signal.

12. The data retention cell of claim 11, wherein the master-slave flip-flop further comprises an inverter coupled between the output port of the slave latch unit and the third output port of the master-slave flip-flop, the second inverter being coupled to be powered by the virtual power.

13. The data retention cell of claim 1, wherein the master-slave flip-flop further comprises:
    a first inverter having an input port coupled to the second input port of the master-slave flip-flop for receiving the internal clock, and an output port for outputting a complemented internal clock, the first inverter being coupled to be powered between the real supply voltage and the real ground voltage;
    a first transmission gate having an enable input port coupled to the output port of the first inverter, an inverted enable input port coupled to the second input port of the master-slave flip-flop, an output port coupled to the input port of the master latch unit, and an input port coupled to the first input port of the master-slave flip-flop;
    a second transmission gate having an enable input port coupled to the second input port of the master-slave flip-flop, an inverted enable input port coupled to the output port of the first inverter, an output port coupled to the input port of the slave latch unit, and an input port coupled to the output port of the master latch unit.

14. The data retention cell of claim 13, further comprising:
a second inverter having an input port coupled for receiving a reset signal, and an output port for outputting an internal reset signal, the second inverter being coupled to be powered between the real supply voltage and the real ground voltage.

15. The data retention cell of claim 14, wherein the master-slave flip-flop further comprises a third input port coupled to the output port of the second inverter for receiving the internal reset signal.

16. The data retention cell of claim 15, wherein the master latch unit comprises:
a NOR gate having a first input port coupled to the output port of the first transmission gate, a second input port coupled to the third input port of the master-slave flip-flop, and an output port coupled to the input port of the second transmission gate, the NOR gate being coupled to be powered by the virtual power; and
a tri-state inverter having an enable input port coupled to the output port of the first inverter, an inverted enable input port coupled to the second input port of the master-slave flip-flop, an output port coupled to the output port of the first transmission gate, and an input port coupled to the input port of the second transmission gate, the tri-state inverter being coupled to be powered by the virtual power.

17. The data retention cell of claim 15, wherein the slave latch unit comprises:
a NOR gate having a first input port coupled to the output port of the second transmission gate, a second input port coupled to the third input port of the master-slave flip-flop, and an output port coupled to the first and the second ports of the master-slave flip-flop, the NOR gate being coupled to be powered between the real supply voltage and the real ground voltage; and
a tri-state inverter having an enable input port coupled to the second input port of the master-slave flip-flop, an inverted enable input port coupled to the output port of the first inverter, an output port coupled to the input port of the NOR gate, and an input port coupled to the output port of the NOR gate, the tri-state inverter being coupled to be powered between the real supply voltage and the real ground voltage.

18. The data retention cell of claim 1, wherein the input control circuit further comprises:
an inverter having an input port coupled to the output port of the delay unit, and an output port, the inverter being coupled to be powered by the virtual power;
a first NAND gate having a first input port coupled to the output port of the delay unit, a second input port coupled to the first input port of the input control circuit, and an output port, the first NAND gate being coupled to be powered by the virtual power;
a second NAND gate having a first input port coupled to the output port of the inverter, a second input port coupled to the fourth input port of the input control circuit, and an output port, the second NAND gate being coupled to be powered by the virtual power;
a third NAND gate having a first input port coupled to the output port of the first NAND gate, a second input port coupled to the output port of the second NAND gate, and an output port coupled to the first output port of the input control circuit, the third NAND gate being coupled to be powered by the virtual power; and
an AND gate having a first input port coupled to the second input port of the input control signal, a second input port coupled to the third input port of the input control signal, and an output port coupled to the second output port of the input control circuit, the AND gate being coupled to be powered between the real supply voltage and the real ground voltage.

19. A data retention cell for preserving a complemented output data signal in a power-saving mode comprising:
an input control circuit having a first input port for receiving an input data signal, a second input port for receiving a retention signal, a third input port for receiving a clock, a fourth input port for receiving a feedback signal, a first output port for outputting an internal input data signal, and a second output port for outputting a complemented internal clock, the input control circuit comprising a delay unit, the delay unit having an input port coupled to the second input port of the input control circuit for receiving the retention signal and an output port; and
a master-slave flip-flop having a first input port coupled to the first output port of the input control circuit for receiving the internal input data signal, a second input port coupled to the second output port of the input control circuit for receiving the complemented internal clock, a first output port for outputting the complemented output data signal, and a second output port for outputting the feedback signal, the master-slave flip-flop comprising a master latch unit having an input port and an output port, and a slave latch unit having an input port and an output port, wherein the slave latch unit is coupled to be powered between a real supply voltage and a real ground voltage and the master latch unit is coupled to be powered by a virtual power.

20. The data retention cell of claim 19, wherein the delay unit comprises at least one buffer, the buffer being coupled to be powered by the virtual power.

21. The data retention cell of claim 19, wherein the master latch unit is coupled to be powered between a virtual supply voltage and a virtual ground voltage, between the virtual supply voltage and the real ground voltage, or between the real supply voltage and the virtual ground voltage.

22. The data retention cell of claim 19, wherein the input control circuit further comprises:
a first inverter having an input port coupled to the output port of the delay unit, and an output port, the first inverter being coupled to be powered by the virtual power;
a second inverter having an input port coupled to the first input port of the input control circuit, and an output port, the second inverter being coupled to be powered by the virtual power;
a third inverter having an output port coupled to the first output port of the input control circuit and an input port, the third inverter being coupled to be powered by the virtual power;
a first transistor having a gate coupled to the fourth input port of the input control circuit, a first terminal coupled for receiving a virtual supply voltage, and a second terminal;
a second transistor having a gate coupled to the output port of the delay unit, a first terminal coupled to the second terminal of the first transistor, and a second terminal coupled to the input port of the third inverter;
a third transistor having a gate coupled to the output port of the first inverter, a first terminal coupled to the input port of the third inverter, and a second terminal coupled to the output port of the second inverter;

a fourth transistor having a gate coupled to the gate of the first transistor, a first terminal coupled for receiving a virtual ground voltage, and a second terminal;

a fifth transistor having a gate coupled to the output port of the first inverter, a first terminal coupled to the second terminal of the fourth transistor, and a second terminal coupled to the input port of the third inverter;

a sixth transistor having a gate coupled to the output port of the delay unit, a first terminal coupled to the input port of the third inverter, and a second terminal coupled to the output port of the second inverter; and a NAND gate having a first input port coupled to the second input port of the input control circuit, a second input port coupled to the third input port of the input control circuit for receiving the clock, and an output port coupled to the second output port of the input control circuit for outputting the complemented internal clock, the NAND gate being coupled to be powered between the real supply voltage and the real ground voltage.

23. The data retention cell of claim 22, wherein the first, the second and the third transistors are PMOS transistors.

24. The data retention cell of claim 22, wherein the fourth, the fifth and the sixth transistors are NMOS transistors.

25. The data retention cell of claim 19, further comprising:
a first inverter having an input port coupled for receiving a reset signal, and an output port for outputting an internal reset signal, the first inverter being coupled to be powered by the virtual power.

26. The data retention cell of claim 25, wherein the master-slave flip-flop further comprises a third input port coupled to the output port of the first inverter for receiving the internal reset signal.

27. The data retention cell of claim 26, wherein the master-slave flip-flop further comprises:
a second inverter having an input port coupled to the second input port of the master-slave flip-flop for receiving the complemented internal clock, and an output port for outputting an internal clock, the second inverter being coupled to be powered between the real supply voltage and the real ground voltage;

a first tri-state buffer having an enable input port coupled to the second input port of the master-slave flip-flop, an inverted enable input port coupled to the output port of the second inverter, an output port coupled to the input port of the master latch unit, and an input port coupled to the first input port of the master-slave flip-flop, the first tri-state buffer being coupled to be powered by the virtual power; and a second tri-state buffer having an enable input port coupled to the output port of the second inverter, an inverted enable input port coupled to the second input port of the master-slave flip-flop, an output port coupled to the input port of the slave latch unit, and an input port coupled to the output port of the master latch unit, the second tri-state buffer being coupled to be powered by the virtual power.

28. The data retention cell of claim 27, wherein the master latch unit comprises:
a NOR gate having a first input port coupled to the output port of the first tri-state buffer, a second input port coupled to the third input port of the master-slave flip-flop, and an output port coupled to the input port of the second tri-state buffer, the NOR gate being coupled to be powered by the virtual power; and a tri-state inverter having an enable input port coupled to the output port of the second inverter, an inverted enable input port coupled to the second input port of the master-slave flip-flop, an output port coupled to the output port of the first tri-state buffer, and an input port coupled to the input port of the second tri-state buffer, the tri-state inverter being coupled to be powered by the virtual power.

29. The data retention cell of claim 27, wherein the slave latch unit comprises:
a NOR gate having a first input port coupled to the output port of the second tri-state buffer, a second input port coupled to the third input port of the master-slave flip-flop, and an output port coupled to the second output port of the master-slave flip-flop, the NOR gate being coupled to be powered between the real supply voltage and the real ground voltage; and a tri-state inverter having an enable input port coupled to the second input port of the master-slave flip-flop, an inverted enable input port coupled to the output port of the second inverter, an output port coupled to the input port of the NOR gate, and an input port coupled to the output port of the NOR gate, the tri-state inverter being coupled to be powered between the real supply voltage and the real ground voltage.

30. The data retention cell of claim 19, wherein the master-slave flip-flop further comprises an inverter having an input port coupled to the output port of the slave latch unit, and an output port coupled to the first output port of the master-slave flip-flop, the inverter being coupled to be powered by the virtual power.

31. The data retention cell of claim 30, wherein the master-slave flip-flop further comprises at least two series-connected inverters coupled between the output port of the slave latch unit and the third output port of the master-slave flip-flop for outputting the output data signal, the series-connected inverters being coupled to be powered by the virtual power.

32. The data retention cell of claim 19, wherein the master-slave flip-flop further comprises a third output port for outputting an output data signal.

33. A data retention method for preserving an output data signal of a data retention cell in a power-saving mode, the data retention cell including an input control circuit and a master-slave flip-flop, the method comprising:
powering a slave latch unit of the master-slave flip-flop with a real power;

powering a mater latch unit of the mater-slave flip-flop with a virtual power;

switching a retention signal furnished to the input control circuit from a disable state to an enable state when receiving a power-saving request;

decoupling the virtual power from the real power;

retaining the output data signal in the slave latch unit of the master-slave flip-flop;

coupling the virtual power to the real power when receiving a power-active request;

forwarding the retained output data signal by the input control circuit to the master latch unit of the master-slave flip-flop;

switching the retention signal from the enable state to the disable state; and delaying signal refreshing of the master latch unit by an input data signal through the input control circuit.

34. The data retention method of claim 33, wherein powering the slave latch unit of the mater-slave flip-flop with the real power is powering the slave latch unit of the master-slave flip-flop between a real supply voltage and a real ground voltage.

35. The data retention method of claim 33, wherein powering the mater latch unit of the mater-slave flip-flop with the virtual power is powering the mater latch unit of the mater-slave flip-flop between a virtual supply voltage and a virtual ground voltage, between the virtual supply voltage and a real ground voltage, or between a real supply voltage and the virtual ground voltage.

36. The data retention method of claim 33, wherein switching the retention signal furnished to the input control circuit from the disable state to the enable state when receiving the power-saving request comprises forwarding the output data signal by the input control circuit to the master latch unit of the master-slave flip-flop.

* * * * *